(12) United States Patent
Plechinger

(10) Patent No.: US 12,142,901 B2
(45) Date of Patent: Nov. 12, 2024

(54) CABLE ROUTING BOX, ELECTRICAL SWITCH HAVING A CABLE ROUTING BOX AND SWITCH CABINET HAVING A CABLE ROUTING BOX

(71) Applicant: Siemens Aktiengesellschaft, Munich (DE)

(72) Inventor: Ekkehard Plechinger, Roeckersbuehl (DE)

(73) Assignee: Siemens Aktiengesellschaft, Munich (DE)

( * ) Notice: Subject to any disclaimer, the term of this patent is extended or adjusted under 35 U.S.C. 154(b) by 461 days.

(21) Appl. No.: 17/485,725

(22) Filed: Sep. 27, 2021

(65) Prior Publication Data

US 2022/0102952 A1 Mar. 31, 2022

(30) Foreign Application Priority Data

Sep. 29, 2020 (DE) ...................... 10 2020 212 249.0

(51) Int. Cl.
*H02G 3/08* (2006.01)
*H01H 71/08* (2006.01)
*H05K 7/02* (2006.01)

(52) U.S. Cl.
CPC .............. *H02G 3/08* (2013.01); *H01H 71/08* (2013.01); *H05K 7/02* (2013.01)

(58) Field of Classification Search
CPC ............ H02G 3/08; H02G 3/081; H02G 3/22; H02G 3/24; H02G 15/00; H02G 15/007; H01H 71/08; H01H 71/02; H05K 7/02; H05K 7/00; H05K 7/14; H05K 5/00; H05K 5/02; H05K 5/0217; H05K 5/0247; H02B 1/00; H02B 1/30; H02B 1/06; H02B 1/305
USPC ...... 174/53, 50, 520, 480, 481; 220/3.2–3.9, 220/4.02, 500; 361/600, 601, 641, 361/679.01, 730; 312/223.1, 223.2, 312/223.3, 223.6
See application file for complete search history.

(56) References Cited

U.S. PATENT DOCUMENTS

| | | | | |
|---|---|---|---|---|
| 5,296,647 A | * | 3/1994 | Banker | H02G 3/088 174/58 |
| 6,674,031 B1 | * | 1/2004 | Flegel | H01R 13/713 174/53 |
| 8,559,167 B1 | * | 10/2013 | Czarnecki | H02B 1/46 361/647 |
| 8,727,456 B1 | * | 5/2014 | Bullock | H02B 1/36 361/727 |

FOREIGN PATENT DOCUMENTS

| | | |
|---|---|---|
| DE | 19539995 A1 | 4/1997 |
| DE | 69506514 T2 | 6/1999 |
| EP | 0716487 A1 | 12/1996 |

* cited by examiner

*Primary Examiner* — Angel R Estrada
(74) *Attorney, Agent, or Firm* — Harness, Dickey & Pierce, P.L.C.

(57) ABSTRACT

A cable routing box for fitting to an electrical switch is disclosed, wherein, with the cable routing box fitted, a cable is connected to the electrical switch in a first plane and is routed through the cable routing box. The cable routing box includes a guide for the cable in the cable routing box. The cable exits the cable routing box in a second plane, which differs from the first plane.

17 Claims, 6 Drawing Sheets

CABLE ROUTING BOX, ELECTRICAL SWITCH HAVING A CABLE ROUTING BOX AND SWITCH CABINET HAVING A CABLE ROUTING BOX

PRIORITY STATEMENT

The present application hereby claims priority under 35 U.S.C. § 119 to German patent application number DE 10 2020 212 249.0 filed Sep. 29, 2020, the entire contents of which are hereby incorporated herein by reference.

FIELD

At least some example embodiments relate to cable routing boxes for fitting to an electrical switch, to electrical switches having such a cable routing box, and to switch cabinets having an electrical switch and such a cable routing box.

RELATED ART

For communication purposes, present-day electronic trip units (ETUs) are intended to be contact-connected by means of plug-in lines. For example, a plug-in line can be fitted with a micro USB connector. Connections for plug-in lines are positioned such that the plug-in lines can be connected either from the front side or from the load side. For reasons of space, connection from the line side, or laterally to the ETU, is less appropriate.

Typically, the connection of a cable from the load side is associated with spatial conflicts, as the plug connector will then be arranged in the region of the cutout plane for switch cabinets. In consequence, it has previously been necessary for a client to decide whether an electrical switch is to be installed in a switch cabinet door, in which case the connection of a communication line must be omitted, or whether the switch is to be provided with a communication line, in which case it will be necessary to omit installation in a switch cabinet door.

SUMMARY

At least one example embodiment provides a cable routing box for an electrical switch which permits the plugging in of a plug-in line, and which simultaneously permits installation in a switch cabinet and passage through a switch cabinet door.

The cable routing box for fitting to an electrical switch, according to at least one example embodiment, is configured such that, with the cable routing box fitted, a cable which is connected to the electrical switch in a first plane is routed through the cable routing box, wherein, by a guide means for the cable in the cable routing box, the cable exits the cable routing box in a second plane, which differs from the first plane.

Advantageously, the cable routing box according to at least one example embodiment permits ETU communication cables to be arranged below the cutout plane for switch cabinet doors. As a result, notwithstanding the installation of a switch in a cabinet door, the client can provide the ETU with communication cables, and the connection thereof will be permitted, even in the installed state.

In one configuration of the cable routing box according to at least one example embodiment, the second plane is arranged below the first plane, in the direction of the electrical switch.

In a further configuration, the cable routing box is configured with an essentially cuboid shape.

In a further configuration of the cable routing box according to at least one example embodiment, the latter is configured in two parts, comprising a first part, which can be fitted to the electrical switch, and a second part, which can be fitted to the first part. The first part can be fitted to the electrical switch in two orientations.

Advantageously, with a corresponding construction/design layout of the cable routing box, and in the case of an electrical switch having TMTUs, the cable routing box can also be fitted to a switch in the form of a blanking cable routing box. Cutouts of equal dimensions in the switch cabinet door can accommodate electrical switches having ETUs and electrical switches having TMTUs. As a result, ETU/TMTU switches, in the event of servicing, can be respectively replaced with switches of the other type, in a simpler manner and with no necessity/reduced likelihood for the reworking of the cabinet door. If TMTU switches and ETU switches are of identical design, the resulting impact upon the design of a switch cabinet cutout will be consistent, even in the event of a combination of TMTU switches and ETU switches.

In a further configuration of the cable routing box, the cable routing box can be fitted to the actuating element of the electrical switch.

In a further configuration of the cable routing box according to at least one example embodiment, the latter functions as a strain relief device for a cable which is connected to the electrical switch and is routed through the cable routing box.

Advantageously, a communication cable can be securely connected to the ETU, and any unintentional release of the cable in response to mechanical strain or loading of the cable is not possible.

An electrical switch according to at least one example embodiment, having a cable which is connected to the electrical switch in a first plane, and having a cable routing box according to at least one example embodiment, is configured such that the cable routing box is fitted to the electrical switch, and the cable is routed through the cable routing box.

The switch cabinet according to at least one example embodiment, having a door, an electrical switch having an actuating element, a cable and a cable routing box is configured such that the electrical switch is fitted in the switch cabinet and the cable is connected to the electrical switch, wherein the cable routing box is fitted to the electrical switch and the cable is led through the cable routing box, and wherein the door incorporates a cutout, such that the actuating element and parts of the cable routing box project through the cutout when the door is closed.

In one configuration of the switch cabinet according to at least one example embodiment, the closed door is braced at the height of the first plane of the cable routing box.

In a further configuration of the switch cabinet according to at least one example embodiment, the cable is connected to the electrical switch by means of a connector. The connector can be configured in the form of a USB connector or a micro USB connector.

At least one example embodiment provides a cable routing box for fitting to an electrical switch, wherein, with the cable routing fitted, a cable is connected to the electrical switch in a first plane is routed through the cable routing box, the cable routing box including a guide for the cable in the cable routing box, wherein the cable exits the cable routing box in a second plane, the second plane being different from the first plane.

The above-mentioned properties, features and advantages of example embodiments, together with the manner in which these are achieved, are further explained and clarified with reference to the description of the following exemplary embodiments, which are described in greater detail in conjunction with the figures.

BRIEF DESCRIPTION OF THE DRAWINGS

The above-described properties, features and advantages of this invention, and the manner in which they are achieved, will become clearer and more clearly comprehensible in conjunction with the description below of the example embodiments, which will be explained in more detail in conjunction with the figures, in which.

DETAILED DESCRIPTION OF EXAMPLE EMBODIMENTS

Figure 1A:
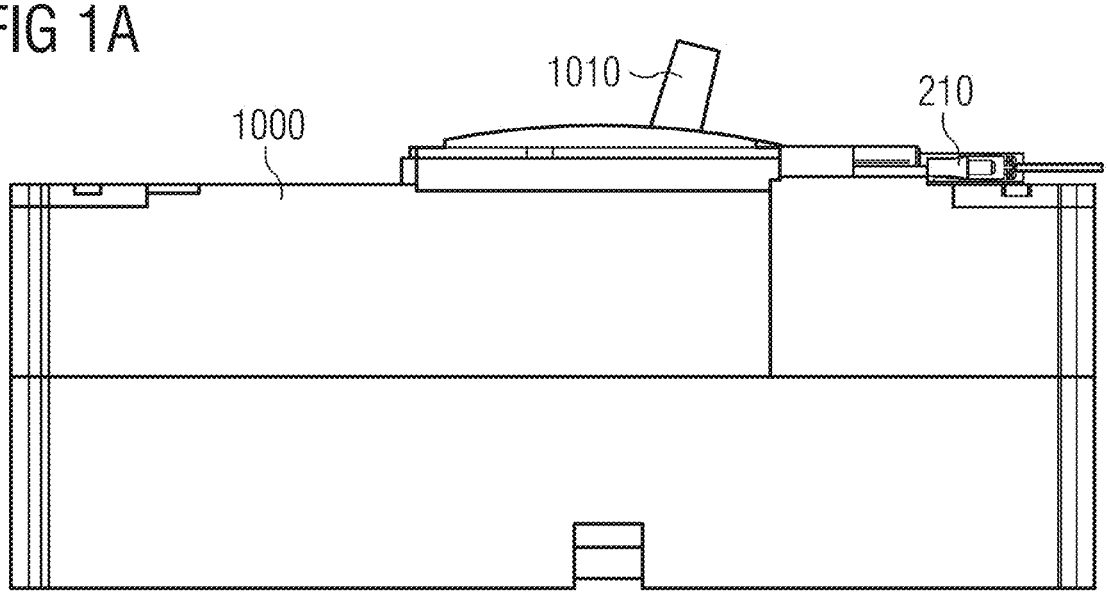
FIGS. 1A and 1B show an electrical switch with a cable and a view of the electrical switch with a cable according to at least one example embodiment.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Specific structural and functional details disclosed herein are merely representative for purposes of describing example embodiments of the present invention. This invention may, however, be embodied in many alternate forms and should not be construed as limited to only the embodiments set forth herein.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

FIG. 1A represents an electrical switch 1000. The electrical switch 1000 comprises, inter alia, an actuating element 1010 for switching an electric current. The electrical switch 1000 can be electrically connected by a cable 200, which is connected to the electrical switch 1000 via a connector 210. The cable 200 can be employed, for example, for the communication of an electronic trip unit (ETU) 600 of the electrical switch 1000 with electronic devices such as laptops, notebooks, tablets or smartphones. The cable 200 is plugged into the electronic trip unit (ETU) 600, and is thus connected to the electrical switch 1000. The connector 210 can be, for example, a USB connector. The connector 210 can also be a micro USB connector.

Figure 1B:
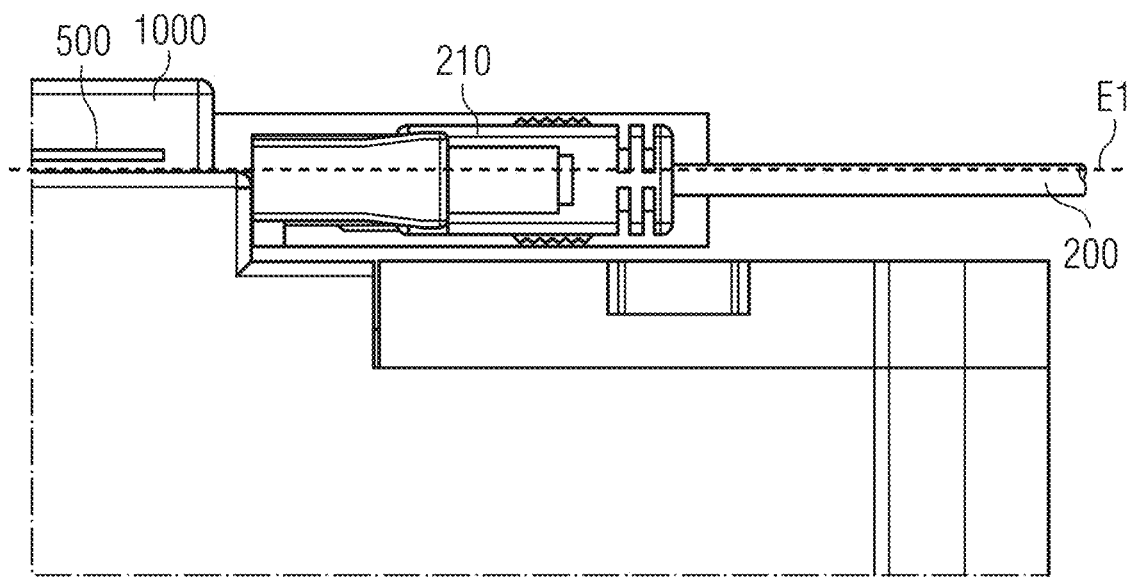

FIG. 1B shows a detailed view of the electrical switch 1000, with the cable 200 and the connector 210. Moreover, a first plane (E1) is represented, in which the cable 200 is connected to the electrical switch 1000. On the load side, the cable 200 is electrically connected to the electrical switch 1000 via the connector 210.

FIG. 1B further represents part of a laterally adjoining switch cabinet door 500. Where the switch cabinet door is closed, for example, the actuating element 1010 and adjoining built-on accessories project through a cutout. According to the representation in FIG. 1B, this implies that the connector 210 is accommodated in the cutout in a switch cabinet door 500 as, with the door 500 closed, there would otherwise be spatial interference between the door 500 and the connector 210. Thus, cutouts of different sizes in switch cabinet doors 500 may be required, depending upon whether or not a cable 200 is connected to the electrical switch 1000.

Figure 2A:
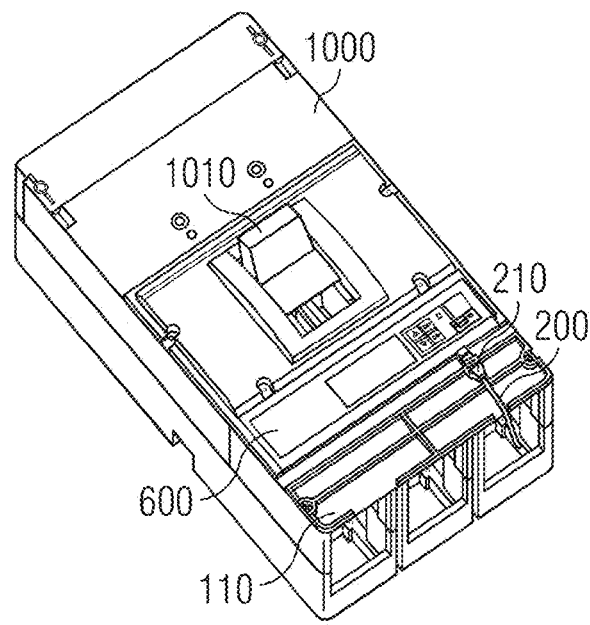
FIGS. 2A, 2B and 2C show an electrical switch with a first part of a cable routing box fitted, an electrical switch with the first part and a second part of the cable routing box fitted, and a side view of the electrical switch with the cable routing box fitted according to at least one example embodiment.

FIG. 2A represents the electrical switch 1000, with an actuating element 1010. Moreover, an electronic trip unit (ETU) 600 is fitted to the electrical switch, to which the cable 200 is electrically connected or plugged-in on the load side by the connector 210.

Figure 2B:
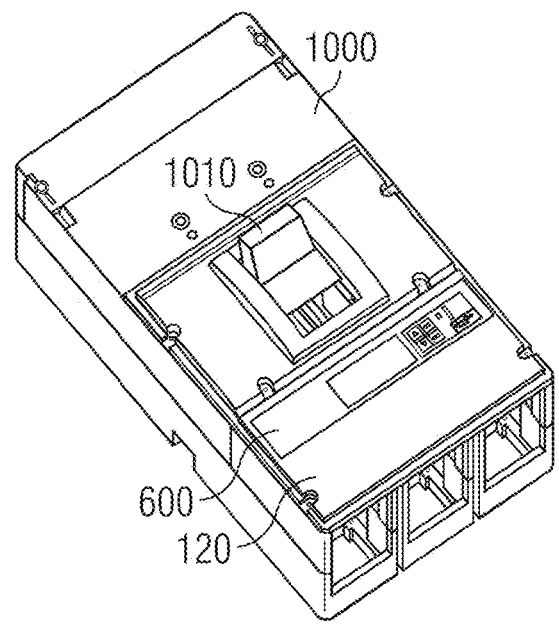

FIG. 2A further represents a cable routing box 110; 120 according to at least one example embodiment. The cable routing box 110; 120 is essentially configured with a cuboid shape, and comprises a first part 110, which is fitted to the electrical switch 1000. In FIG. 2B, the second part 120 of the cable routing box is represented, which is fitted to the first part 110. The cutout for the door 500 of a switch cabinet is constituted by the area which is enclosed by the cable routing box 110; 120, the ETU 600 and the surround of the actuating element 1010.

Figure 2C:
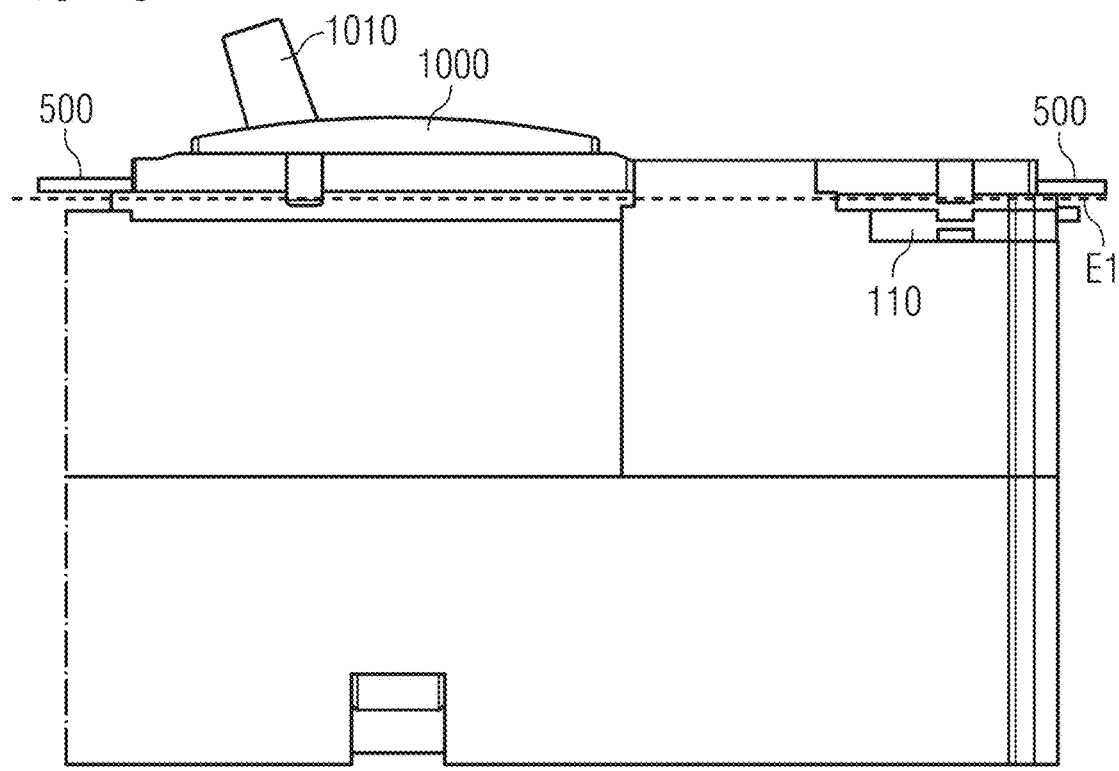

FIG. 2C shows a side view of the electrical switch 1000, with the actuating element 1010, the first part 110 of the cable routing box, and the first plane (E1) in which the cable 200 is connected to the electrical switch 1000. In FIG. 2C, two parts of the door 500 are further represented; they define the cutout in the door 500 which, when the door 500 is closed, permits an operator to access the actuating element 1010 and the electronic trip unit (ETU) 600.

Figure 3A:
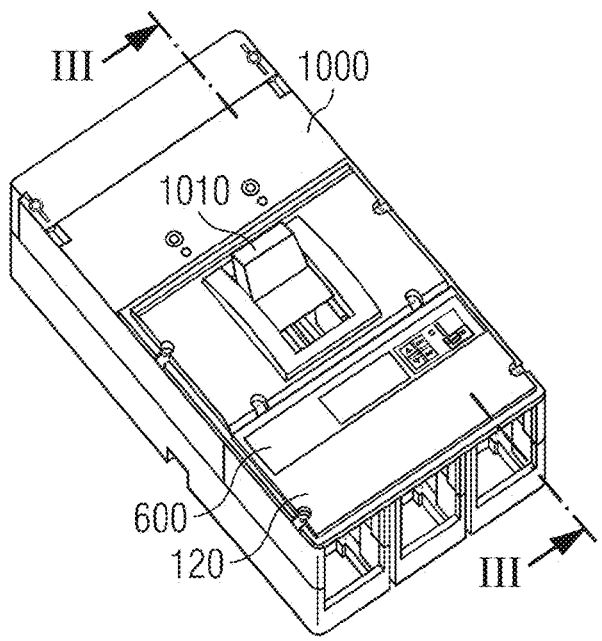
FIGS. 3A and 3B show an electrical switch with the cable routing box fitted, and a side view of the electrical switch with the cable routing box, showing a first plane and a second plane according to at least one example embodiment.
Figure 3B:
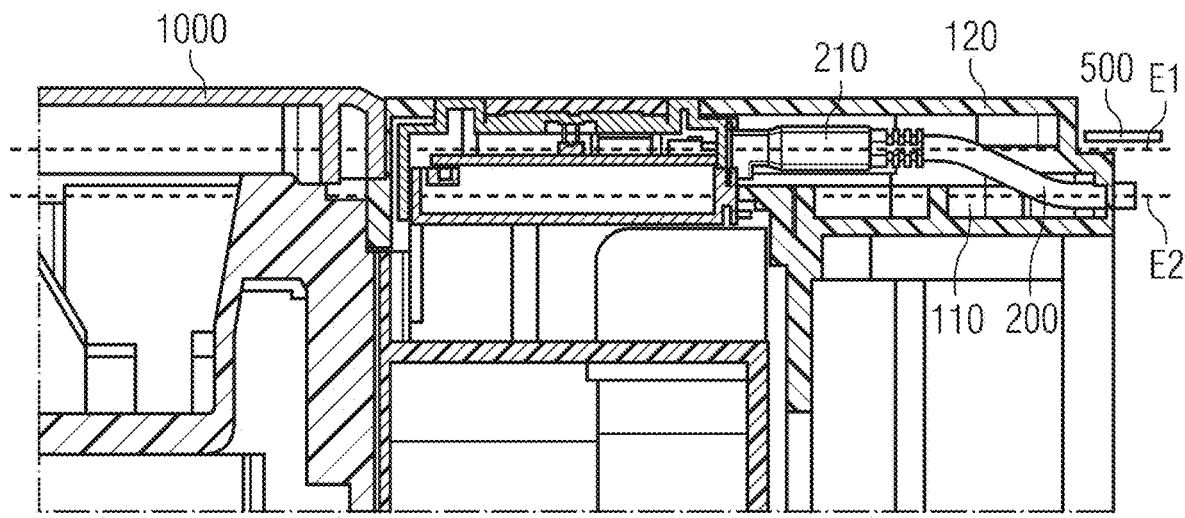

FIG. 3A shows the electrical switch 1000, with the actuating element 1010 and the electronic trip unit (ETU) 600, together with the cable routing box 120. The detailed view represented in FIG. 3B clarifies the function of the cable routing box 110; 120. The cable 200 is connected by the connector 210 to the electrical switch 1000 in a first plane (E1). In this first plane (E1), a closed door 500 also engages with the cable routing box 110; 120. A guide for the cable 200 in the cable routing box 110; 120 compel the cable 200 to exit the cable routing box 110; 120 in a second plane (E2). This second plane (E2) differs from the first plane (E1). The second plane (E2) is arranged below the first plane (E1) in the direction of the electrical switch 1000 (e.g., the first plane (E1) is closer to an exposed external surface of the second part 120 than the second plane (E2)). The cable 200 is thus routed below the first plane (E1), such that no spatial interference can occur with the closed door 500 of a switch cabinet.

Figure 4A:
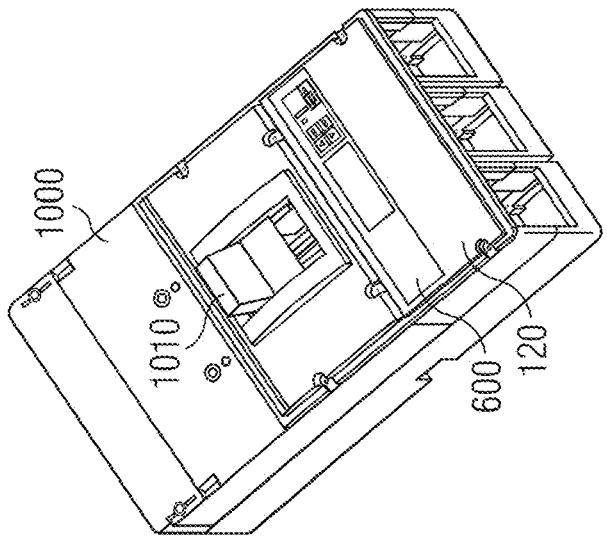
FIGS. 4A, 4B and 4C show an electrical switch with an ETU and a cable routing box, an electrical switch with a TMTU and a cable routing box, and an electrical switch with a TMTU and no cable routing box according to at least one example embodiment.
Figure 4A:
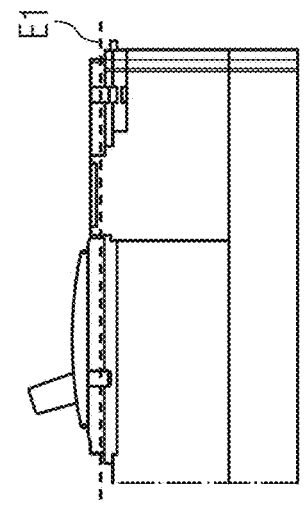

FIG. 4A shows the electrical switch 1000, with the actuating element 1010, together with an electronic trip unit (ETU) 600 and a cable routing box 110; 120. The cable routing box 110; 120 is configured in two parts, and it is the second part 120, which is fitted to the first part 110, which is visible in the representation according to FIG. 4A.

Figure 4B:
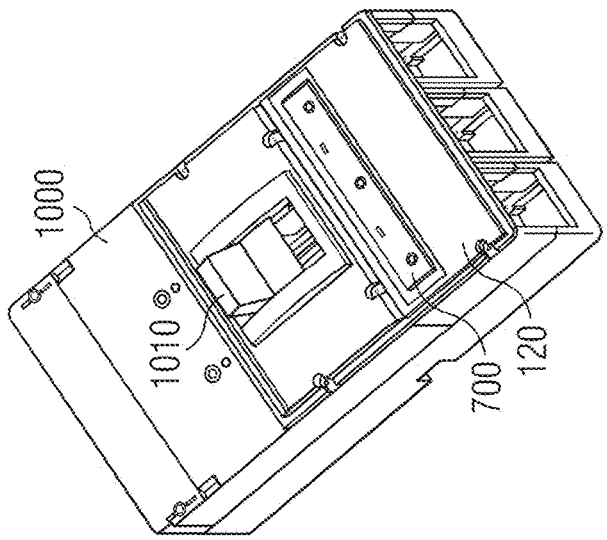
Figure 4B:
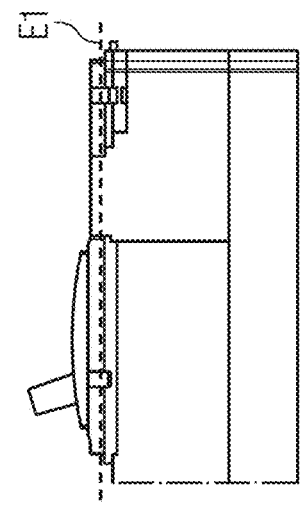
Figure 4C:
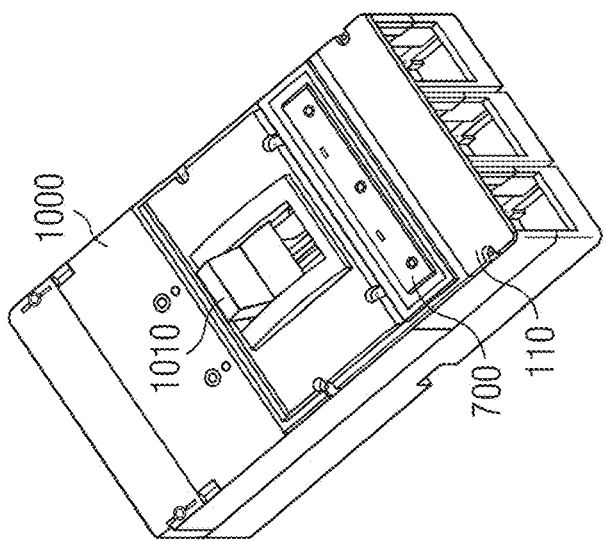
Figure 4C:
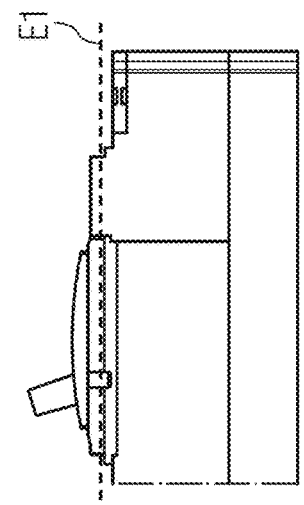

In FIGS. 4B and 4C, a TMTU 700 is fitted to the electrical switch 1000, in place of an electronic trip unit (ETU) 600. In such a case, typically, there is no provision for the connection of a cable 200 to the electrical switch 1000. In this case, it is either possible, according to FIG. 4B, for the complete cable routing box 110; 120 to be fitted to the electrical switch, such that the cutout in the door 500 of a switch cabinet is identical to the cutout in a door 500 according to FIG. 4A, in the case of an electronic trip unit (ETU) 600 (blanking cable routing box). However, it is also possible for only the first part 110 of the cable routing box 110; 120 to be fitted, as represented in FIG. 4C, such that the cutout for the door 500 of a switch cabinet can be configured with smaller dimensions, and terminates at the TMTU 700.

Figure 5B:
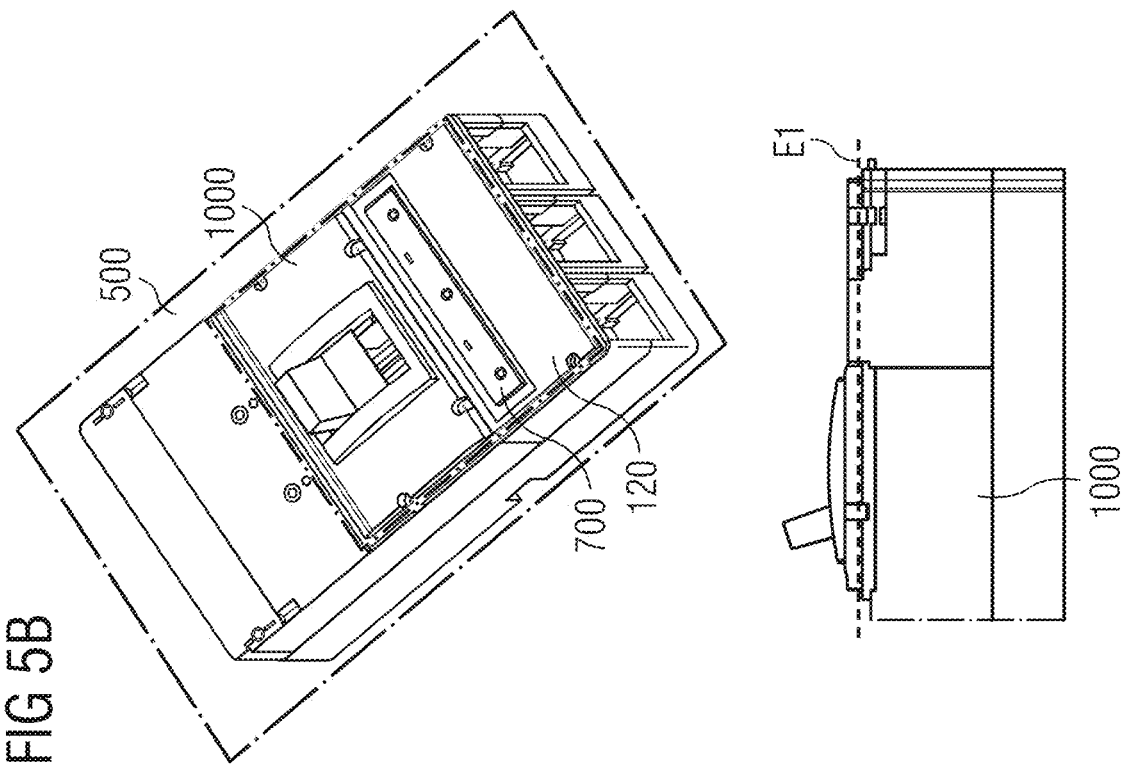
FIGS. 5A, 5B and 5C show an electrical switch with an ETU and a cable routing box, with a switch cabinet door closed, an electrical switch with a TMTU and a cable routing box, with the switch cabinet door closed, and an electrical switch with a TMTU and no cable routing box, with the switch cabinet door closed according to at least one example embodiment.
Figure 5A:
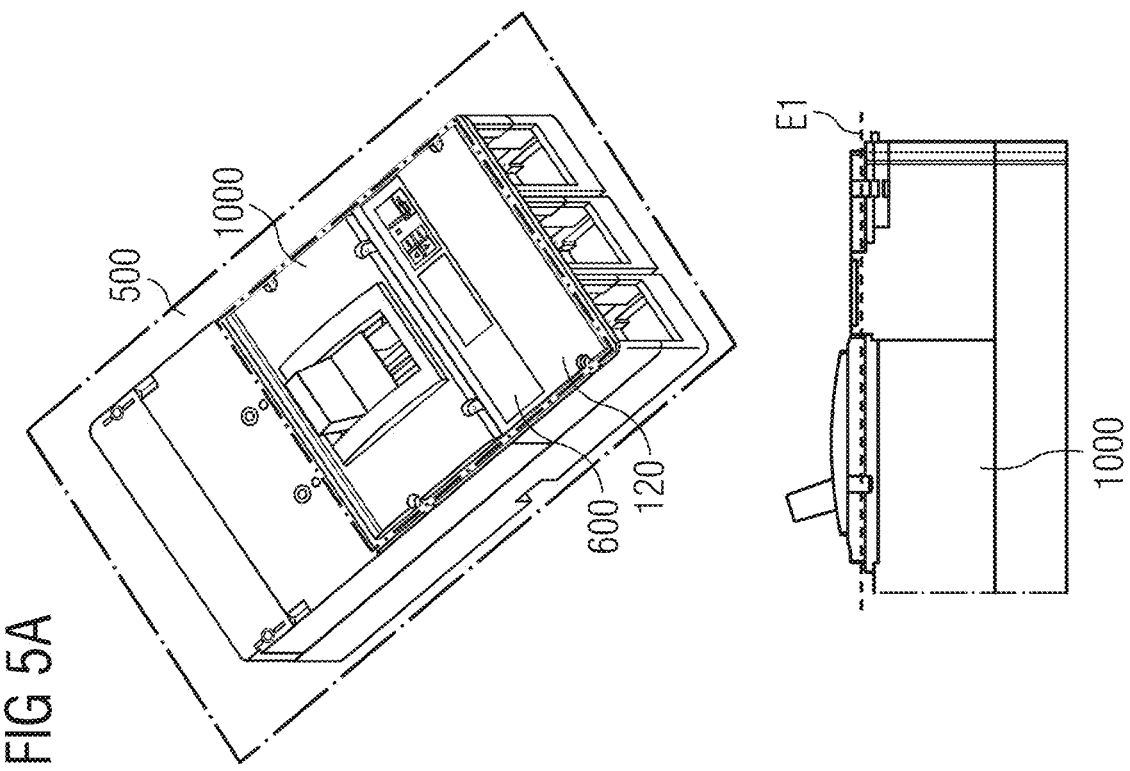
Figure 5C:
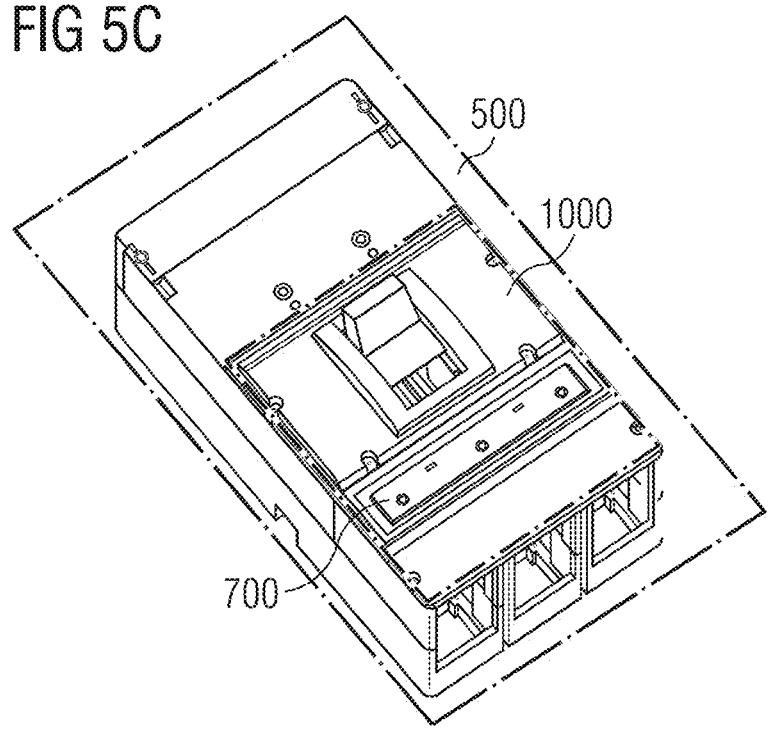
Figure 5C:
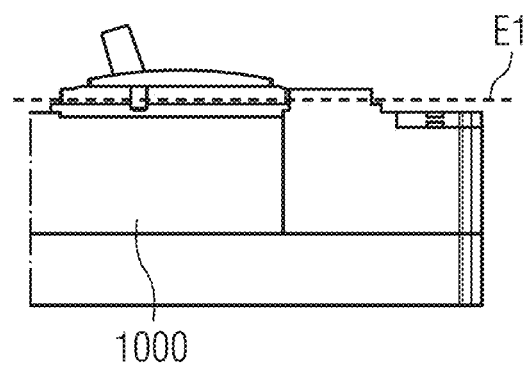

In FIGS. 5A, 5B and 5C, in an analogous manner to FIGS. 4A, 4B and 4C, the respective electrical switches 1000 are represented, with an electronic trip unit (ETU) 600 or TMTU 700, additionally to the door 500 of a switch cabinet. As described, the selected cutout in the door 500 in FIGS. 5A and 5B can be of equal dimensions, as the complete cable routing box 110; 120 is fitted to the electrical switch 1000— this applies likewise in the case of the TMTU 700, according to the representation in FIG. 5B.

Where the first part 110 is fitted to the electrical switch 1000 in its second orientation, according to the representation in FIG. 4C, the structural height of the cable routing box 110 is reduced, such that the cutout in the door 500 can be smaller, and terminates at the TMTU 700, as represented in FIG. 5C.

In order to route the cable 200 below the level of the cutout plane for the switch cabinet door 500, this cable is fed from an electronic trip unit (ETU) 600 to a cable routing box 110; 120 which adjoins the load side. In this cable routing box 110; 120, the cable 200 is deflected below the cutout plane for a switch cabinet door, corresponding to the first plane (E1), and only exits the cable routing box 110; 120 in a second plane (E2). Advantageously, the cable routing box 110; 120, at the first part thereof 110, which can be fitted directly to the electrical switch 1000, simultaneously employs a space which has been reserved for the switch connection terminal cover.

The cable routing box 110; 120 can be employed as a strain relief device for a cable which is connected to the electrical switch 1000, and is routed through the cable routing box 110; 120. The cable routing box 110; 120 provides an outlet opening for the cable 200. The cable routing box 110; 120 can also function as a terminal cover for the connection terminals of the switch.

Using the cable routing box 110; 120, it is possible for the electronic trip unit (ETU) 600, with a cable 200, to be deliberately positioned below the cutout plane for switch cabinet doors, which corresponds to the first plane. As a result, the client, notwithstanding the installation of the electrical switch 1000 in a cabinet door 500, can still fit cables 200 to the electronic trip unit (ETU) 600, which can also be connected in the installed state. In the event of the operation of the electrical switch 1000 with a TMTU 700, the cable routing box 110; 120 can function as a blanking cable routing box 110; 120, and can be built onto the electrical switch 1000. It is thus achieved that the electrical switch 1000 with an electronic trip unit (ETU) 600 and an electrical switch with a TMTU 700 assume equal cutout dimensions in the switch cabinet door 500. As a result, ETU/TMTU switches, during servicing, can be respectively replaced with switches of the other type, in a simple manner and with no necessity for the reworking of the cabinet door 500. Where TMTU switches and ETU switches assume an identical design, a front-mounted combination of TMTU switches and ETU switches can be executed, with uniform consequences for the design and the switch cabinet cutout. Due to the cable strain relief executed in the cable routing box 110; 120, the cable 200 is securely connected to the electronic trip unit (ETU) 600. Any unintentional release of the cable 200 in response to mechanical strain or loading is no longer possible.

While at least some example embodiments have been described and illustrated in detail above with reference to the drawings and preferred embodiments, example embodiments are not limited to these disclosed embodiments, and more embodiments may be obtained, as may be appreciated by those of ordinary skill in the art based on the abovementioned embodiments; these embodiments also fall within the protection scope of the present invention.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A switch cabinet comprising:
   an electrical switch fitted in the switch cabinet, the electrical switch including an actuating element;
   a cable connected to the electrical switch in a first plane;
   a cable routing box fitted to the electrical switch, the cable routing box configured to guide the cable in cable routing box such that the cable exits the cable routing box in a second plane, the second plane being different from the first plane; and
   a door including a cutout configured such that the actuating element and parts of the cable routing box project through the cutout when the door is closed.

2. The switch cabinet as claimed in claim 1, wherein the second plane is below the first plane in a longitudinal direction of the electrical switch.

3. The switch cabinet as claimed in claim 1, wherein the cable routing box is configured with an essentially cuboid shape.

4. The switch cabinet as claimed in claim 1, wherein the cable routing box includes,
- a first part configured to be fitted to the electrical switch, and
- a second part configured to be fitted to the first part.

5. The switch cabinet as claimed in claim 4, wherein the first part can be fitted to the electrical switch in two orientations.

6. The switch cabinet as claimed in claim 1, wherein the cable routing box is fitted to the actuating element.

7. The switch cabinet as claimed in claim 1, wherein the cable routing box is configured to provide support for the cable, the cable being routed through the cable routing box.

8. The switch cabinet as claimed in claim 1, wherein the closed door is braced at a height of the first plane of the cable routing box.

9. The switch cabinet as claimed in claim 1, wherein the cable is connected to the electrical switch via a connector.

10. The switch cabinet as claimed in claim 9, wherein the connector is a USB connector or a micro USB connector.

11. The switch cabinet as claimed in claim 2, wherein the cable routing box is configured with an essentially cuboid shape.

12. The switch cabinet as claimed in claim 2, wherein the cable routing box includes,
- a first part configured to be fitted to the electrical switch, and
- a second part configured to be fitted to the first part.

13. The switch cabinet as claimed in claim 3, wherein the cable routing box includes,
- a first part configured to be fitted to the electrical switch, and
- a second part configured to be fitted to the first part.

14. The switch cabinet as claimed in claim 2, wherein the cable routing box is fitted to the actuating.

15. The switch cabinet as claimed in claim 3, wherein the cable routing box is fitted to the actuating element.

16. The switch cabinet as claimed in claim 2, wherein the cable routing box is configured to provide support for the cable, the cable being routed through the cable routing box.

17. The switch cabinet as claimed in claim 3, wherein the cable routing box is configured to provide support for the cable, the cable being routed through the cable routing box.

* * * * *